(12) United States Patent
Hwang et al.

(10) Patent No.: US 9,000,814 B2
(45) Date of Patent: Apr. 7, 2015

(54) COARSE LOCK DETECTOR

(71) Applicant: Samsung Display Co., Ltd., Yongin, Gyunggi-Do (KR)

(72) Inventors: Moon-Sang Hwang, Yongin (KR); Won-Jun Choe, Yongin (KR); Han-Kyu Chi, Yongin (KR); Deog-Kyoon Jeong, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/256,862

(22) Filed: Apr. 18, 2014

(65) Prior Publication Data

US 2014/0312941 A1    Oct. 23, 2014

Related U.S. Application Data

(62) Division of application No. 13/398,532, filed on Feb. 16, 2012, now Pat. No. 8,729,937.

(30) Foreign Application Priority Data

Feb. 16, 2011    (KR) .................. 10-2011-0013739

(51) Int. Cl.
*H03L 7/00* (2006.01)
*H03L 7/095* (2006.01)
*H03L 7/081* (2006.01)
*H03L 7/10* (2006.01)

(52) U.S. Cl.
CPC .............. *H03L 7/095* (2013.01); *H03L 7/0812* (2013.01); *H03L 7/101* (2013.01)

(58) Field of Classification Search
USPC ......... 327/153, 39–43, 47–49, 113, 115, 156, 327/158, 147, 149, 150, 152, 154, 159, 161, 327/162, 163
See application file for complete search history.

(56) References Cited

U.S. PATENT DOCUMENTS

| 6,326,826 | B1 * | 12/2001 | Lee et al. ...................... 327/161 |
| 6,621,352 | B2 | 9/2003 | Matsumoto et al. |
| 7,199,626 | B2 | 4/2007 | Yu et al. |
| 7,733,138 | B2 | 6/2010 | Uehara et al. |
| 2008/0116983 | A1 * | 5/2008 | Kinugasa et al. ............... 331/25 |
| 2009/0167387 | A1 | 7/2009 | Kim |

FOREIGN PATENT DOCUMENTS

| KR | 10-0411551 B1 | 12/2003 |
| KR | 10-0564595 B1 | 3/2006 |
| KR | 10-0656464 B1 | 12/2006 |

* cited by examiner

*Primary Examiner* — Lincoln Donovan
*Assistant Examiner* — Thomas Skibinski
(74) *Attorney, Agent, or Firm* — Knobbe Martens Olson & Bear LLP

(57) ABSTRACT

A coarse lock detector for a delayed locked loop (DLL) is disclosed. The coarse lock detector includes multiple detection cells. Each detection cell receives a delayed clock phase and an output of a previous detection cell as inputs. To increase time for the output of the previous detection cell to propagate, the detection cells are arranged in groups such that the output from the previous detection cell is generated by a detection cell which is more than one detection cell previous.

19 Claims, 14 Drawing Sheets

COARSE LOCK DETECTOR

CROSS-REFERENCE TO RELATED APPLICATIONS

This application is a divisional of prior U.S. application Ser. No. 13/398,532, entitled Coarse Lock Detector, filed on Feb. 16, 2012, which claims priority from Korean Patent Application No. 10-2011-0013739, filed on Feb. 16, 2011 in the Korean Intellectual Property Office, the disclosures of which are incorporated herein by reference in their entireties.

BACKGROUND OF THE INVENTION

1. Field

The described technology relates to a delayed locked loop (DLL), and more particularly, to a coarse lock detector for a DLL.

2. Description of the Related Technology

Generally, a semiconductor integrated circuit operates using clocks to control its operating speed. Accordingly, the semiconductor integrated circuit includes a clock buffer to buffer clocks input from an external source. In some cases, the semiconductor integrated circuit uses a delayed locked loop (DLL) circuit or a phase-locked loop (PLL) circuit to generate and use an internal clock whose phase difference from an external clock has been corrected.

In particular, DLLs are being widely used as zero delay buffers due to their superior jitter characteristics and better stability than PLLs. However, a conventional DLL is likely to have a stuck problem or harmonic lock when operating at high speed.

FIG. 1 illustrates a structure of a conventional DLL including a coarse lock detector 11. Referring to FIG. 1, a plurality of delay elements 15 generates a set of multiphase clocks PH[1] through PH[15] by incrementally delaying an input reference clock CLK_IN. The coarse lock detector 11 receives the input reference clock CLK_IN and a plurality of multiphase clocks. In FIG. 1, some (PH[5], PH[7], PH[9], PH[11], PH[13] and PH[15]) of the multiphase clocks PH[1] through PH[15] generated by the delay elements 15 are input to the coarse lock detector 11. Within one cycle of the input reference clock CLK_IN, the coarse lock detector 11 continuously counts the number of rising edges of the received multiphase clocks and determines whether a phase of the rising edge of each multiphase clock lags behind a phase of the input reference clock CLK_IN, leads the phase of the input reference clock CLK_IN, or is locked to the phase of the input reference clock CLK_IN.

When the coarse lock detector 11 determines that the phase of the rising edge of each multiphase clock lags behind the phase of the input reference clock CLK_IN, phase locking cannot be achieved since a delay chain is too slow. Therefore, the coarse lock detector 11 generates an UP signal indicating a direction in which the frequency should be adjusted. On the other hand, when the coarse lock detector 11 determines that the phase of the rising edge of each multiphase clock leads the phase of the input reference clock CLK_IN, phase locking cannot be achieved since the delay chain is too fast. Therefore, the coarse lock detector 11 generates a DOWN signal. That is, frequency locking can be achieved by adjusting the frequency by using the UP or DOWN signal.

The stuck problem and harmonic lock are considerations that must be taken into account when designing a DLL and can be solved using a coarse lock detector. However, a conventional coarse lock detector that samples multiphase clocks cannot operate at high speed.

SUMMARY OF THE INVENTION

One inventive aspect is a coarse lock detector including first through p-th detection cells which receive p multiphase clocks generated by incrementally delaying a reference clock. The first through p-th detection cells are divided into a first detection cell group of 2m+1 detection cells and a second detection cell group of 2n detection cells, where p is an integer equal to or greater than three, m is an integer equal to or greater than zero when 2m+1 is equal to or smaller than p, and n is an integer equal to or greater than one when 2n is equal to or greater than p.

Another inventive aspect is a coarse lock detector including first through p-th detection cells which receive p multiphase clocks generated by incrementally delaying a reference clock. The first through p-th detection cells are divided into a first detection cell group of 3k+1 detection cells, a second detection cell group of 3s+2 detection cells, and a third detection cell group of 3r detection cells, where p is an integer equal to or greater than four, k is an integer equal to or greater than zero when 3k+1 is equal to or smaller than p, s is an integer equal to or greater than zero when 3s+2 is equal to or smaller than p, and r is an integer equal to or greater than one when 3r is equal to or smaller than p.

Another inventive aspect is a coarse lock detector including first through P-th detection cells which receive P multiphase clocks generated by incrementally delaying a reference clock. The first through P-th detection cells are divided into first through U-th detection cell groups corresponding to the first through P-th multiphase clocks, where each of the first through U-th detection cell groups includes $(1 \times A_{(W)}+W)$-th through $(U \times A_{(W)}+W)$-th detection cells, where U is an integer equal to or greater than four, P is an integer greater than U, W is an integer that satisfies $1 \leq W \leq U$, and $A_{(W)}$ is an integer equal to or greater than zero when each of $(1 \times A_{(W)}+W)$ through $(U \times A_{(W)}+W)$ is equal to or greater than P.

BRIEF DESCRIPTION OF THE DRAWINGS

The above and other aspects and features will become more apparent by describing in detail exemplary embodiments with reference to the attached drawings, in which.

DETAILED DESCRIPTION OF CERTAIN INVENTIVE EMBODIMENTS

Various features and aspects are described more fully hereinafter with reference to the accompanying drawings, in which certain embodiments are shown. The invention may, however, be embodied in different forms and should not be construed as limited to the embodiments set forth herein. Rather, these embodiments are provided so that this disclosure will be thorough and complete. The same reference numbers generally indicate the same components throughout the specification. In the attached figures, the thickness of layers and regions may be exaggerated for clarity.

Unless defined otherwise, technical and scientific terms used herein generally have the same meaning as commonly understood by one of ordinary skill in the art. It is noted that the use of examples, or exemplary terms provided herein are not intended as a limitation on the scope of the invention unless otherwise specified. Further, unless defined otherwise, terms defined in generally used dictionaries may not be overly interpreted.

Figure 2:
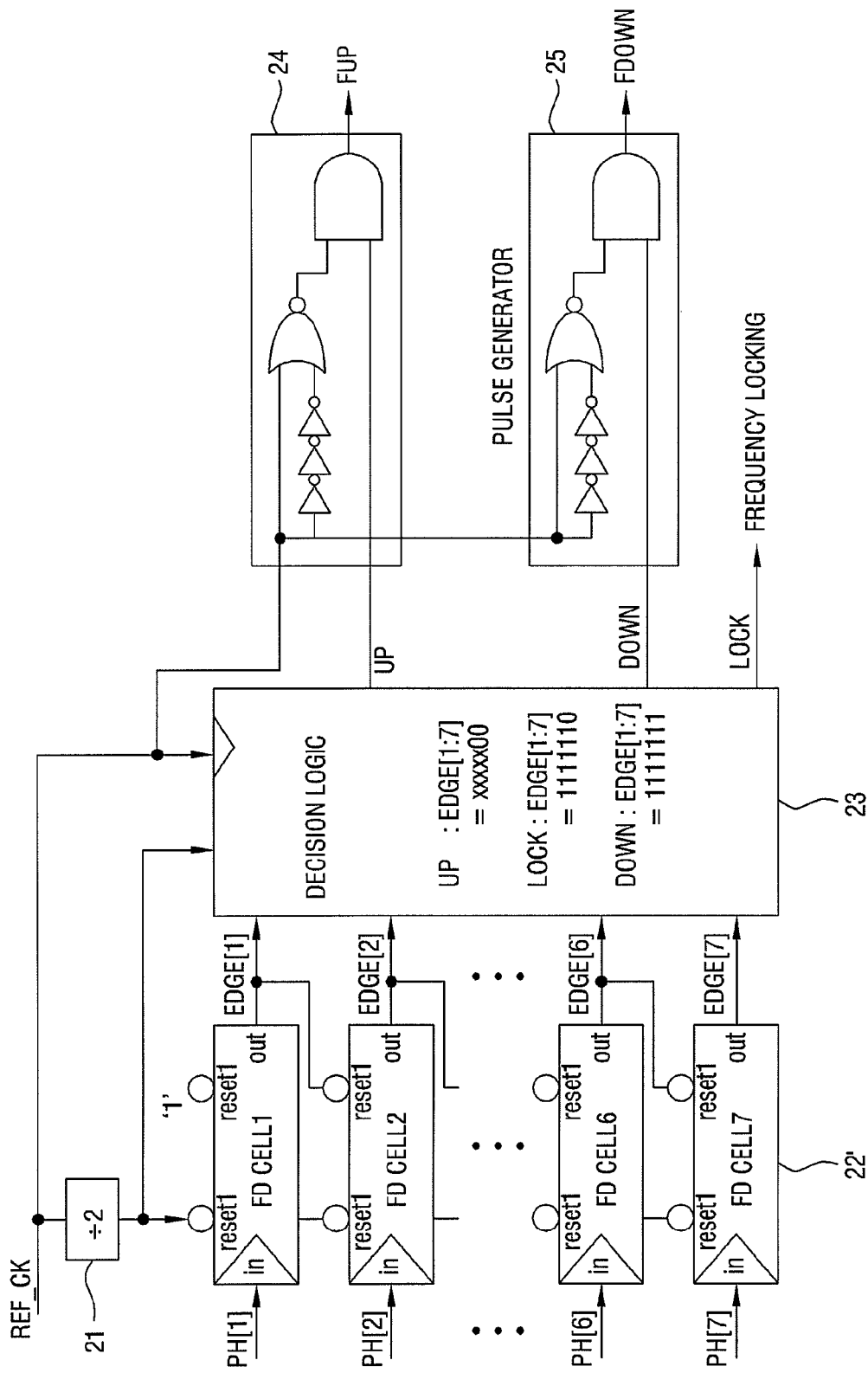
FIG. 2 illustrates a conventional coarse lock detector for a DLL.
Figure 3:
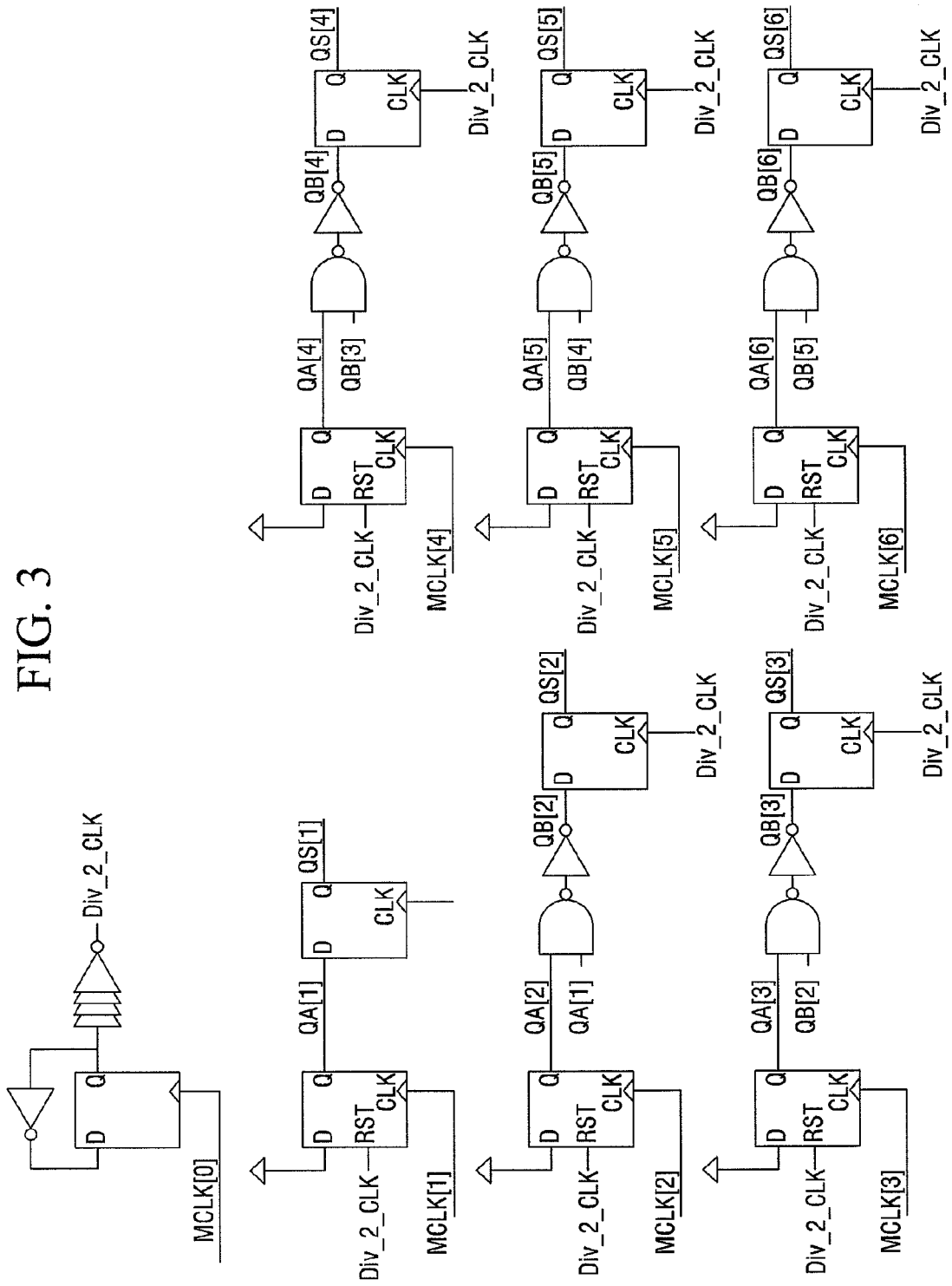
FIG. 3 illustrates an example configuration of frequency detection cells in a coarse lock detector for a DLL.
Figure 4:
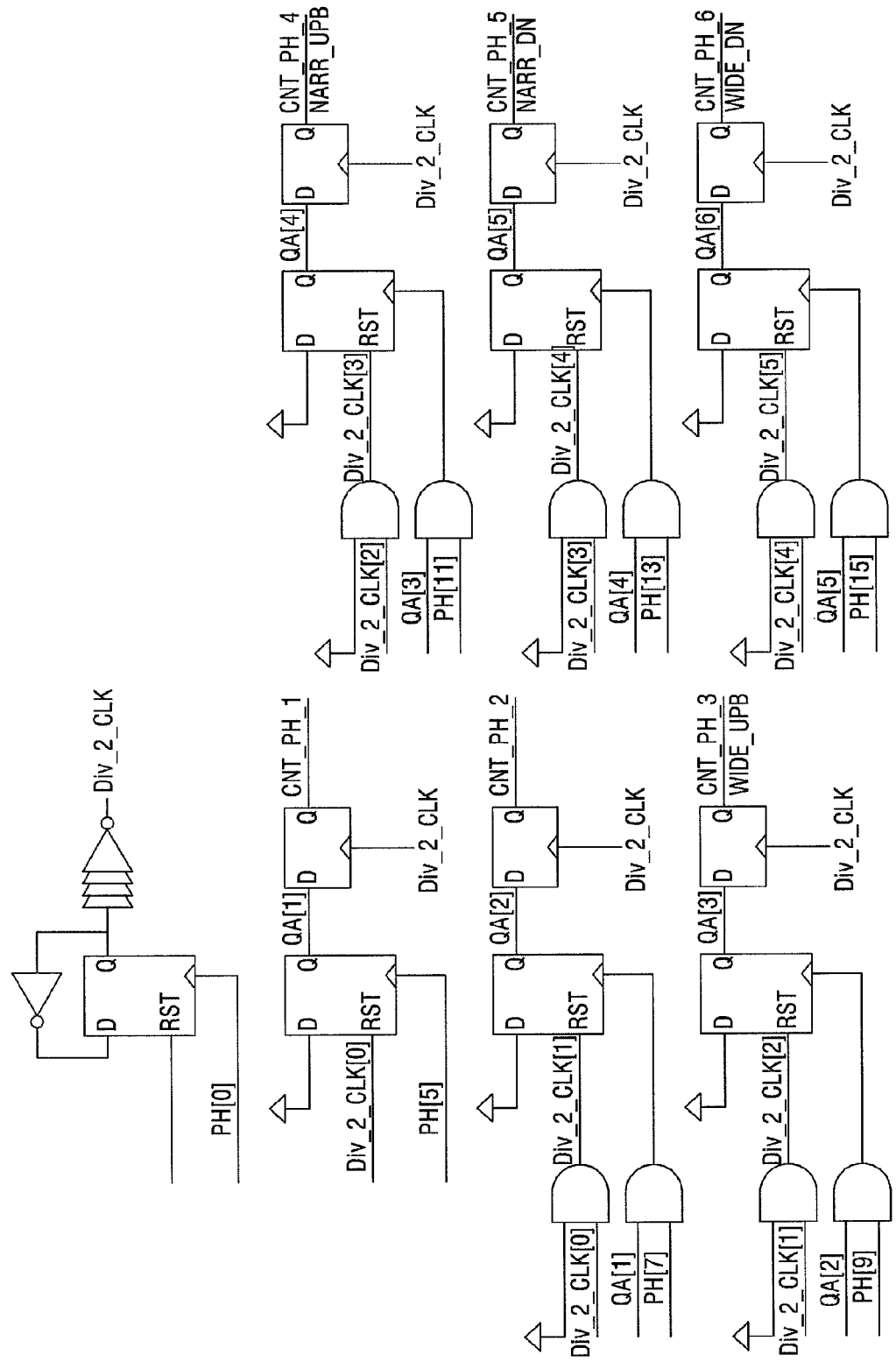
FIG. 4 illustrates another example configuration of frequency detection cells in a coarse lock detector for a DLL.
Figure 5:
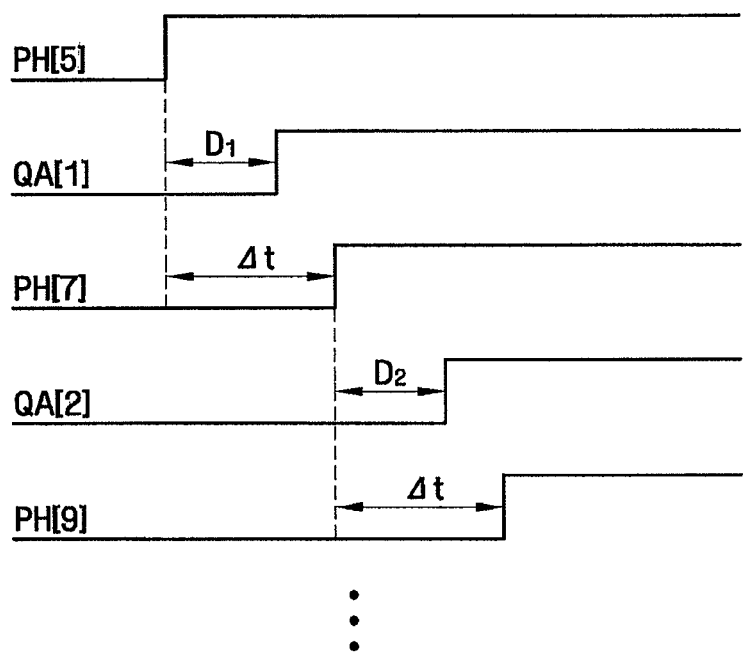
FIG. 5 shows waveforms of signals when a coarse lock detector operates normally.

FIG. 2 illustrates a conventional coarse lock detector for a delayed locked loop (DLL). FIGS. 3 and 4 illustrate example configurations of frequency detection cells in a coarse lock detector for a DLL. FIG. 5 shows waveforms of signals when a coarse lock detector operates normally.

Referring to FIG. 2, the conventional coarse lock detector included in the DLL may include a plurality of frequency detection cells 22 which respectively receive a plurality of multiphase clocks generated by incrementally delaying a reference clock REF_CK and process the received multiphase clocks, decision logic 23, a divider 21, and two pulse generators 24 and 25. Certain aspects of the embodiments relate particularly to the configuration of the frequency detection cells.

Figure 7:
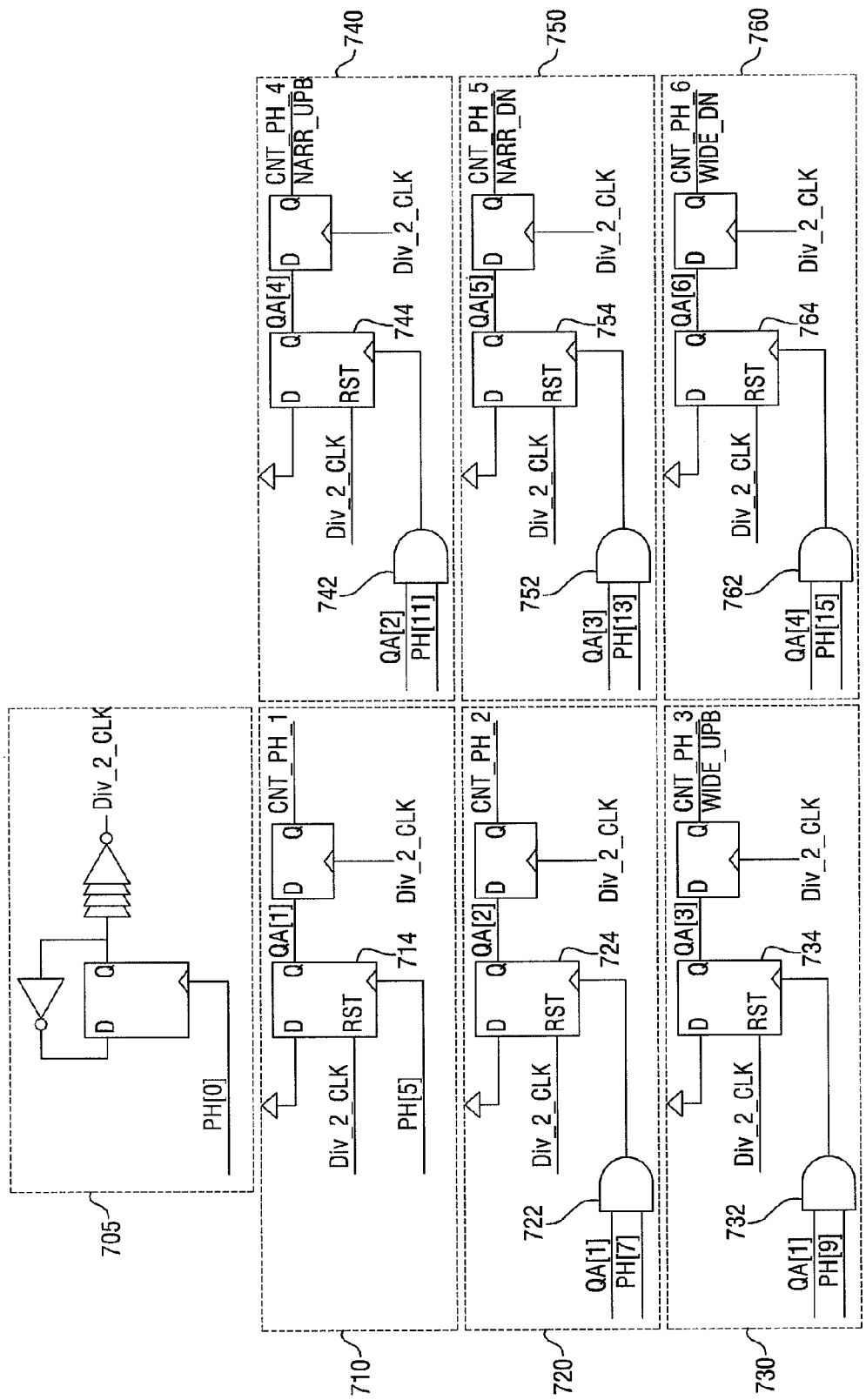
FIG. 7 illustrates the configuration of frequency detection cells in a coarse lock detector according to an exemplary embodiment.

Hereinafter, a coarse lock detector shown in FIG. 7 is described in comparison with those of FIGS. 3 and 4. The coarse lock detector of FIG. 3 is structured to sample multiphase clocks and then to decide the order of edges of the sampled multiphase clocks. When the DLL operates at high speed, the coarse lock detector structured as in FIG. 3 can sample multiphase clocks without any problem. However, when the DLL operates at low speed, the coarse lock detector detects an edge one cycle before an edge of subsequent incoming multiphase clock. Therefore, the DLL may fall into harmonic lock.

The coarse lock detector of FIG. 4 is structured to sequentially sample multiphase clocks, that is, sample a multiphase clock QA[n−1] and then a next multiphase clock QA[n]. When the DLL operates at high speed, the coarse lock detector structured as in FIG. 4 cannot properly sample multiphase clocks, causing a stuck problem.

Figure 6:
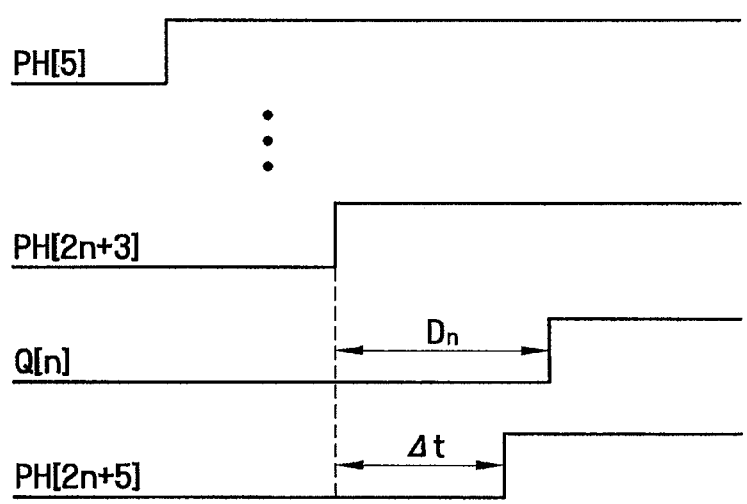
FIG. 6 shows waveforms of signals when a stuck problem occurs.

Specifically, in FIGS. 5 and 6, Δt indicates a time interval between multiphase clocks, and each of $D_1$ through Dn indicates a period of time for which a signal is delayed as it goes through an AND gate and a flip-flop in each frequency detection cell. For each multiphase clock to be sampled properly without the stuck problem, the following equation must be satisfied as shown in FIG. 5.

$$Dn < \Delta t \quad (1).$$

More specifically, referring to FIG. 5, for example, a frequency detection cell shown in the bottom left corner of FIG. 4 receives a signal QA[2], which is output from a previous frequency detection cell as a result of properly sampling a multiphase clock, as an input signal. The frequency detection cell can then sample a multiphase clock PH[9] using its AND gate. That is, the signal QA[2] is set before a rising edge of the multiphase clock PH[9] as shown in FIG. 5. The frequency detection cell and the signals QA[2] and PH[9] used here are mere examples. It can be understood that the same should apply to the other frequency detection cells as well to avoid the stuck problem.

On the other hand, if the following equation is satisfied as shown in FIG. 6 in a certain frequency detection cell, the stuck problem occurs.

$$Dn > \Delta t \quad (2).$$

That is, when a delay time caused by a logic gate and a flip-flop is longer than a time interval between multiphase clocks, a rising edge of a multiphase clock is not properly sampled. Once the rising edge of the multiphase clock fails to be sampled, edges of subsequent multiphase clocks will not be counted. Consequently, a small number of rising edges are sampled. Accordingly, the pulse generator 24 shown in FIG. 2 generates an UP signal, causing the stuck problem. This situation is more likely to occur when the DLL operates at high speed, that is, when the interval between multiphase clocks is reduced.

To address the stuck problem, if the interval between multiphase clocks is simply increased, that is, if, for example, odd-numbered multiphase clocks PH[5], PH[9], PH[13], . . . are used, the DLL may fall into harmonic lock when operating at low speed. Ultimately, the DLL cannot operate in a wide frequency range.

An exemplary embodiment of a coarse lock detector s to solve the above problem will now be described with reference to FIG. 7. Referring to FIG. 7, a coarse lock detector using an even/odd sampling method does not sequentially process multiphase clocks, that is, in order of a first frequency detection cell, a second frequency detection cell, a third frequency detection cell, a fourth frequency detection cell, a fifth frequency detection cell, and a sixth frequency detection cell as illustrated in FIG. 4. Instead, the coarse lock detector of FIG. 7 processes the multiphase clocks using two groups of frequency detection cells, that is, a first group including the first frequency detection cell, the third frequency detection cell, and the fifth frequency detection cell, and another group including the second frequency detection cell, the fourth frequency detection cell, and the sixth frequency detection cell. In this case, the time interval Δt doubles as compared to the case of FIG. 4. That is, dividing frequency detection cells into a group of even-numbered frequency detection cells and a group of odd-numbered frequency detection cells and sampling multiphase clocks using the two groups increases a timing margin, and the increased timing margin prevents the occurrence of the stuck problem in the DLL when operating at high speed.

A coarse lock detector according to the current exemplary embodiment will now be described in greater detail with reference to FIGS. 7 and 8. In FIG. 7, six frequency detection cells 710 through 760 are described as an example. However, this is merely an example used for ease of description. A change in the number of frequency detection cells can be made and is within the scope of the present invention. In addition, multiphase clocks are input, as input signals, at intervals of two multiphase clocks, such as PH[5], PH[7], PH[9], . . . , PH[15]. However, the present invention is not limited thereto, and those of ordinary skill in that art understand that the interval between the multiphase clocks can be adjusted without departing from the scope of the present invention.

Figure 1:
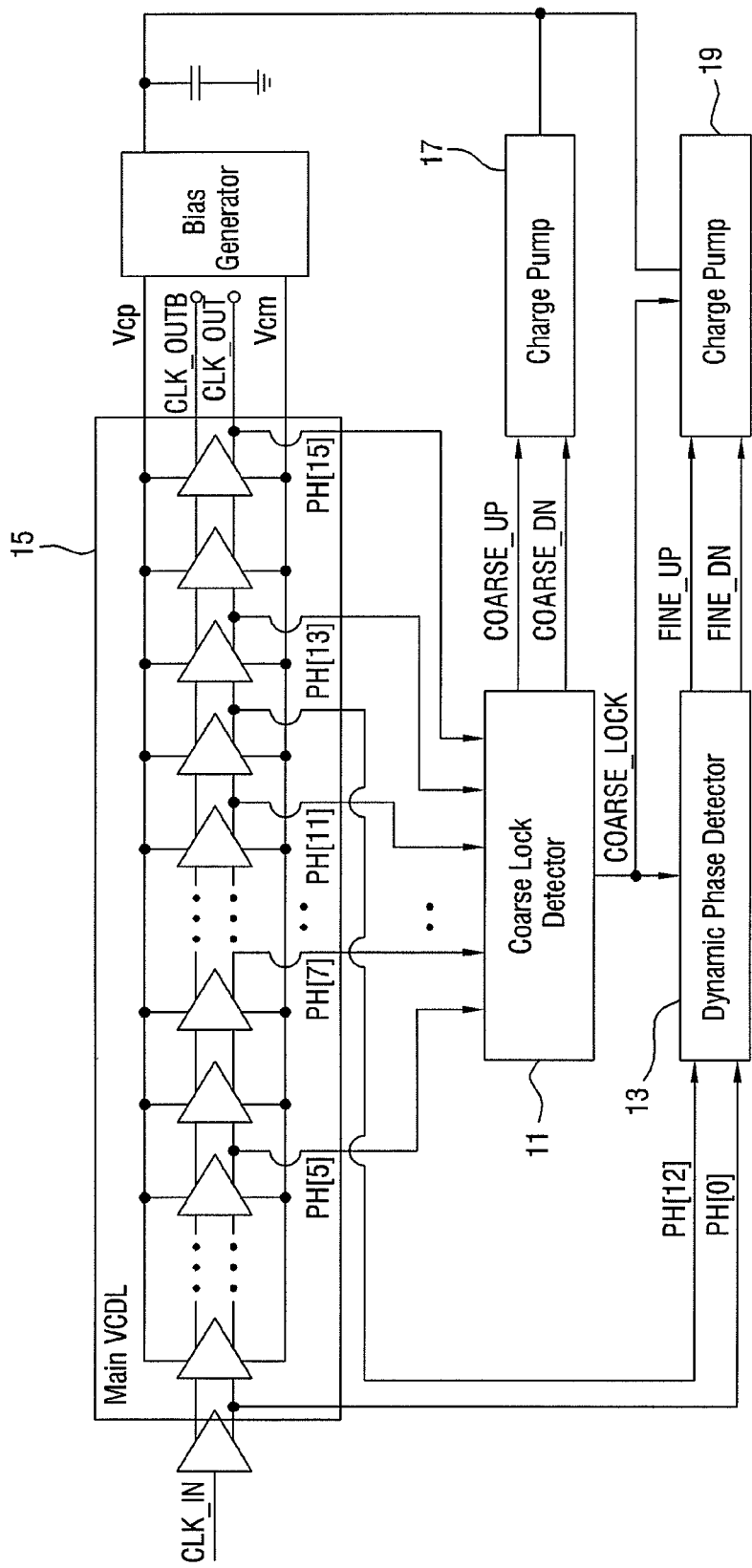
FIG. 1 illustrates a conventional delayed locked loop (DLL) including a coarse lock detector.

In FIG. 7, a total of six frequency detection cells respectively receive one of six multiphase clocks, which are spaced at predetermined intervals, as first input signals. Delay elements 15 (see FIG. 1) generate the multiphase clocks by delaying a reference clock PH[0]. If there are a total of p frequency detection cells, an equal number of multiphase clocks that is, p multiphase clocks may be input to the p frequency detection cells as the first input signals. If the coarse lock detector of FIG. 7 includes first through $p^{th}$ frequency detection cells, the first through $p^{th}$ frequency detection cells receive first through $p^{th}$ multiphase clocks as their respective first input signals.

A divider 705 receives the reference clock PH[0] and outputs a clock signal whose frequency is half the frequency of the reference clock PH[0]. The clock signal whose frequency is half the frequency of the reference clock PH[0] is input to each of the first through $p^{th}$ multiphase clocks as a third input signal.

A third frequency detection cell 730 receives an output signal QA[1] of a first frequency detection cell 710 as its second input signal, performs an AND operation on the signal QA[1] and a multiphase clock PH[9] received as a first input signal by using an AND gate 732, and sends the result of the AND operation to a flip-flop 734. A signal QA[3] output from the flip-flop 734 is used as a second input signal of a fifth frequency detection cell 750.

The fifth frequency detection cell 750 receives the output signal QA[3] of the third frequency detection cell 730 as its second input signal, performs an AND operation on the signal QA[3] and a multiphase clock PH[13] received as a first input signal by using an AND gate 752, and sends the result of the AND operation to a flip-flop 754. A signal QA[5] output from the flip-flop 754 may be used as a second input signal of a next frequency detection cell, for example, a seventh frequency detection cell if it exists.

Similarly, a fourth frequency detection cell 740 receives an output signal QA[2] of a second frequency detection cell 720 as its second input signal, performs an AND operation on the signal QA[2] and a multiphase clock PH[11] received as a first input signal by using an AND gate 742, and sends the result of the AND operation to a flip-flop 744. A signal QA[4] output from the flip-flop 744 is used as a second input signal of a sixth frequency detection cell 760.

The sixth frequency detection cell 760 receives the output signal QA[4] of the fourth frequency detection cell 740 as its second input signal, performs an AND operation on the signal QA[4] and a multiphase clock PH[15] received as a first input signal by using an AND gate 762, and sends the result of the AND operation to a flip-flop 764. A signal QA[6] output from the flip-flop 764 may be used as a second input signal of a next frequency detection cell, for example, an eighth frequency detection cell if it exists.

In summary, frequency detection cells are divided into a group of even-numbered (2n) frequency detection cells and a group of odd-numbered (2m+1) frequency detection cells to process and sample first through $p^{th}$ multiphase clocks, respectively. Here, sampling a multiphase clock denotes generating an output signal which is set in response to a rising edge of each of the first through $p^{th}$ multiphase clocks input respectively to the first through $p^{th}$ frequency detection cells. In addition, m represents an integer equal to or greater than zero when 2m+1 is equal to or smaller than p, and n is an integer equal to or greater than one when 2n is equal to or smaller than p.

Figure 8:
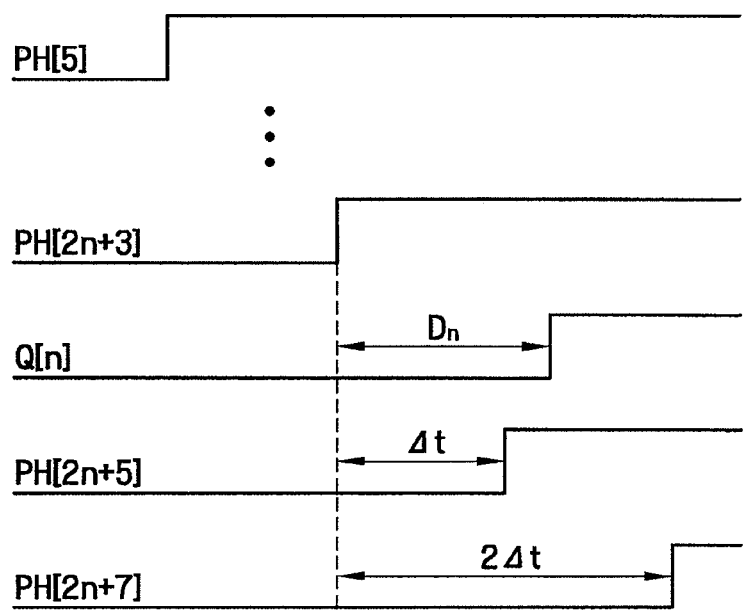
FIG. 8 is a waveform diagram illustrating a timing margin that doubled when the coarse lock detector of FIG. 7 was used.

If the structure of the coarse lock detector shown in FIG. 7 is used, even when Dn is greater than Δt as shown in FIG. 6, there is no problem as long as Dn is maintained less than 2Δt (see FIG. 8). In other words, since the above structure doubles the timing margin, the stuck problem does not occur even when the DLL operates at high speed, i.e., even when a value of Δt is small.

The second frequency detection cell 720 receives the output signal QA[1] of the first frequency detection cell 710 as its second input signal. This is because no even-numbered frequency detection cell exists before the second frequency detection cell 720. Therefore, the second frequency detection cell 720 receives the output signal QA[1] of the first frequency detection cell 710 as its second input signal, performs an AND operation on the signal QA[1] and a multiphase clock PH[7] received as a first input signal by using an AND gate 722, and sends the result of the AND operation to a flip-flop 724. The signal QA[2] output from the flip-flop 724 is used as the second input signal of the fourth frequency detection cell 740.

As described above, the second frequency detection cell 720 receives and processes the output signal QA[1] of the first frequency detection cell 710. In this case, the value of Δt may be reduced as compared to other cases. However, since the first frequency detection cell 710 includes no AND gate, no AND gate delay occurs, thus not causing a great loss in timing margin. That is, a delay time $D_1$ in the first frequency detection cell 710 is caused only by the flip-flop 714. Therefore, the delay time $D_1$ in the first frequency detection cell 710 is shorter than the delay time Dn in the other frequency detection cells. Accordingly, even when the second frequency detection cell 720 receives the output signal QA[1] of the first frequency detection cell 710 as the input signal and generates the signal QA[2] using the received signal QA[1], there is no problem since a loss in timing margin is small.

The first frequency detection cell 710 does not require an AND gate since it does not need to receive and process an output signal of a previous frequency detection cell. Accordingly, the first frequency detection cell 710 receives only a multiphase clock PH[5], which is a first multiphase clock, as a first input signal and samples the multiphase clock PH[5].

The output signals QA[1] through QA[p] of the first through $p^{th}$ frequency detection cells are input to decision logic 23 as shown in FIG. 2. The decision logic 23 decides whether the frequency is locked and generates a signal (UP or DOWN) based on the decision result, thereby adjusting the frequency.

Figure 9:
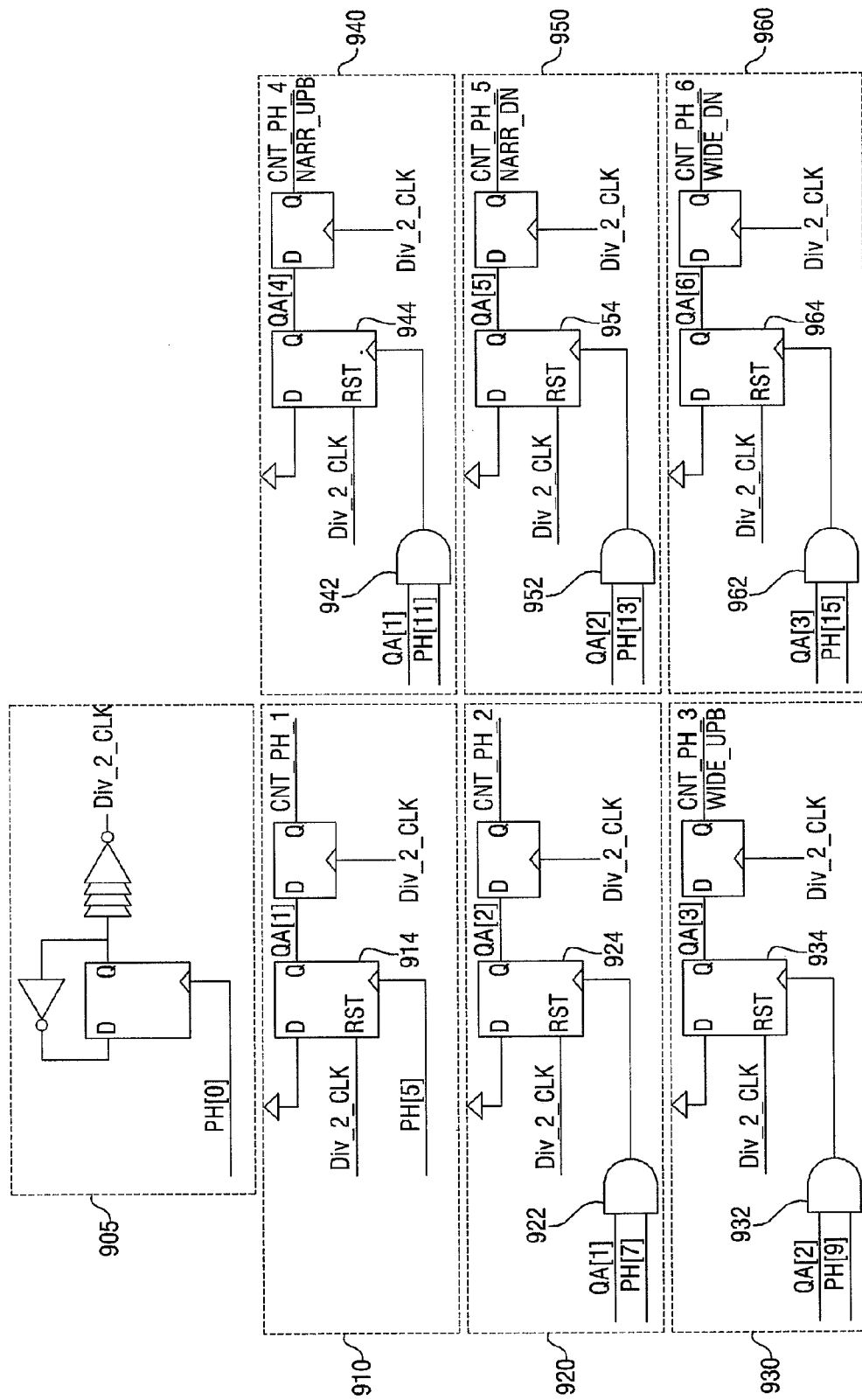
FIG. 9 illustrates the configuration of frequency detection cells in a coarse lock detector according to another exemplary embodiment.

FIG. 9 illustrates a coarse lock detector according to another exemplary embodiment. The frequency detection cells are divided into a group of even-numbered frequency detection cells and a group of odd-numbered frequency detection cells to sample multiphase clocks in FIG. 7. In FIG.

9, they are divided into three groups. The basic configuration of each frequency detection cell in FIG. 9 is similar to that of each frequency detection cell in FIG. 7. Therefore, the following description will focus on differences from FIG. 7.

Referring to FIG. 9, the coarse lock detector processes multiphase clocks using three groups of frequency detection cells, that is, a first group including a first frequency detection cell, a fourth frequency detection cell, and a seventh frequency detection cell, a second group including a second frequency detection cell, a fifth frequency detection cell, and an eighth frequency detection cell, and a third group including a third frequency detection cell, a sixth frequency detection cell, and a ninth frequency detection cell.

In FIG. 9, six frequency detection cells 910 through 960 are illustrated as an example. However, this is merely an example used for ease of illustration in the drawing. A change in the number of frequency detection cells can be made within the scope of the present invention. Therefore, if the coarse lock detector of FIG. 9 further includes seventh through ninth frequency detection cells, multiphase clocks may be processed as discussed above.

In addition, if there are first through $p^{th}$ frequency detection cells, the first through $p^{th}$ frequency detection cells may be divided into a first detection cell group of first, fourth, and seventh frequency detection cells, a second detection cell group of second, fifth, and eighth frequency detection cells, and a third detection cell group of third, sixth, and ninth frequency detection cells to correspond to the first through $p^{th}$ multiphase clocks. Here, r represents an integer equal to or greater than one when 3r is equal to or less than p, k is an integer equal to or greater than zero when 3k+1 is equal to or less than p, and s is an integer equal to or greater than zero when 3s+2 is equal to or less than p.

More specifically, a second input signal of a fourth frequency detection cell 940 is an output signal QA[1] of a first frequency detection cell 910, a second input signal of a fifth frequency detection cell 950 is an output signal QA[2] of a second frequency detection signal 920, and a second input signal of a sixth frequency detection cell 960 is an output signal QA[3] of a third frequency detection cell 930. In this case, the value of Δt triples as compared to the case of FIG. 4.

A second input signal of the third frequency detection cell 930 is the output signal QA[2] of the second frequency detection cell 920, and a second input signal of the second frequency detection cell 920 is the output signal QA[1] of the first frequency detection cell 910.

In FIGS. 7 and 9, the embodiments in which frequency detection cells are divided into two and three groups are illustrated, respectively. However, the present invention is not limited to these embodiments. Any embodiment in which multiphase clocks are sampled at intervals of multiple multiphase clocks and the sampled multiphase clocks are combined to increase an operating frequency is included in the present invention.

In other words, in some embodiments, a coarse lock detector may include first through $P^{th}$ frequency detection cells which respectively receive one of P multiphase clocks generated by incrementally delaying a reference clock and are set in response to rising edges of first through $P^{th}$ multiphase clocks. The first through $P^{th}$ frequency detection cells may be divided into a number of groups, e.g., first through $U^{th}$ detection cell groups to respond to the first through $P^{th}$ multiphase clocks.

When the first through $P^{th}$ frequency detection cells are divided into the first through $U^{th}$ detection cell groups, if U is, e.g., four, the first through $P^{th}$ frequency detection cells may be divided into a $4 \times A_{(1)}+1$ group of first, fifth, ninth . . . frequency detection cells, a $4 \times A_{(2)}+2$ group of second, sixth, tenth . . . frequency detection cells, a $4 \times A_{(3)}+3$ group of third, seventh, eleventh . . . frequency detection cells, and a $4 \times A_{(4)}+4$ group of fourth, eighth, twelfth . . . frequency detection cells.

In this case, each of frequency detection cells included in a group uses an output signal of a previous frequency detection cell as its second input signal. For example, if U is four, the fifth frequency detection cell uses an output signal of the first frequency detection cell as its second input signal, and the ninth frequency detection cell uses an output signal of the fifth frequency detection cell as its second input signal (in the case of the $4 \times A_{(1)}+1$ group). In addition, the sixth frequency detection cell uses an output signal of the second frequency detection cell as its second input signal, and the tenth frequency detection cell uses an output of the sixth frequency detection cell as its second input signal (in the case of the $4 \times A_{(2)}+2$ group). In other groups, signals of frequency detection cells are also connected as described above.

Each of second through $U^{th}$ frequency detection cells uses an output signal of an immediately previous frequency detection cell as its second input signal. For example, if U is four, the fourth frequency detection cell uses an output signal of the third frequency detection cell as its second input signal, the third frequency detection cell uses the output signal of the second frequency detection cell as its second input signal, and the second frequency detection cell uses an output signal of the first frequency detection cell as its second input signal.

When the first through $P^{th}$ frequency detection cells are divided into the U detection groups, the value of Δt increases U times as compared to the case of FIG. 4.

Effects that can be achieved when such a coarse lock detector is used is described with reference to FIGS. 10 through 15. In FIGS. 10 through 15, simulations were all conducted at 1.2 GHz. A condition in which an initial control voltage is zero, that is, a control voltage has a low initial value is a condition that causes harmonic lock, and a condition in which the initial control voltage is VDD, that is, the control voltage has a high initial value is a condition that causes the stuck problem.

Figure 10:
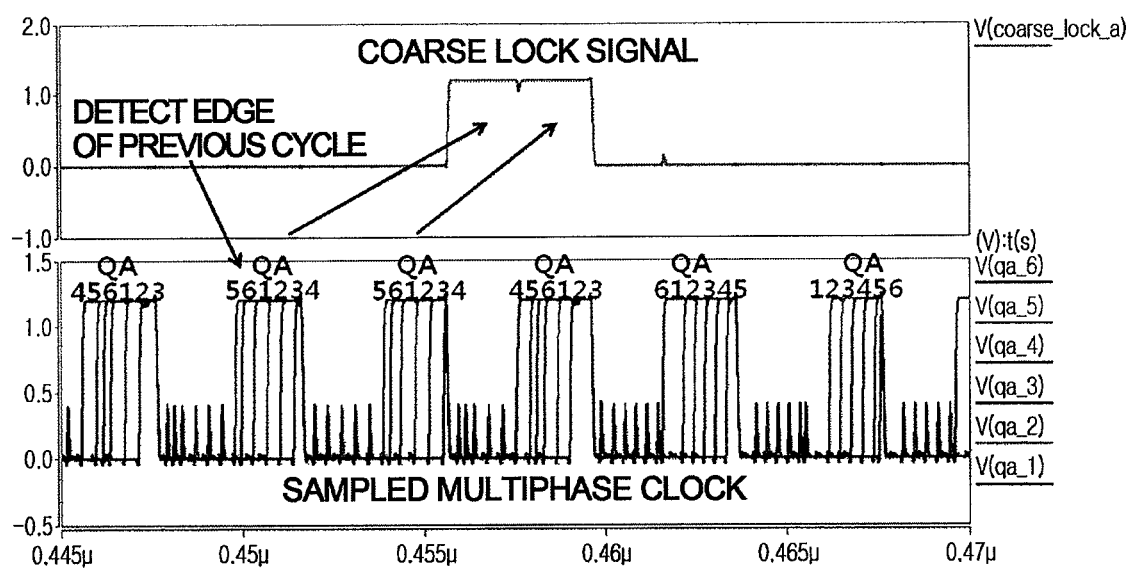
FIG. 10 shows simulation results obtained when the configuration of the frequency detection cells in the coarse lock detector of FIG. 3 was used.
Figure 11:
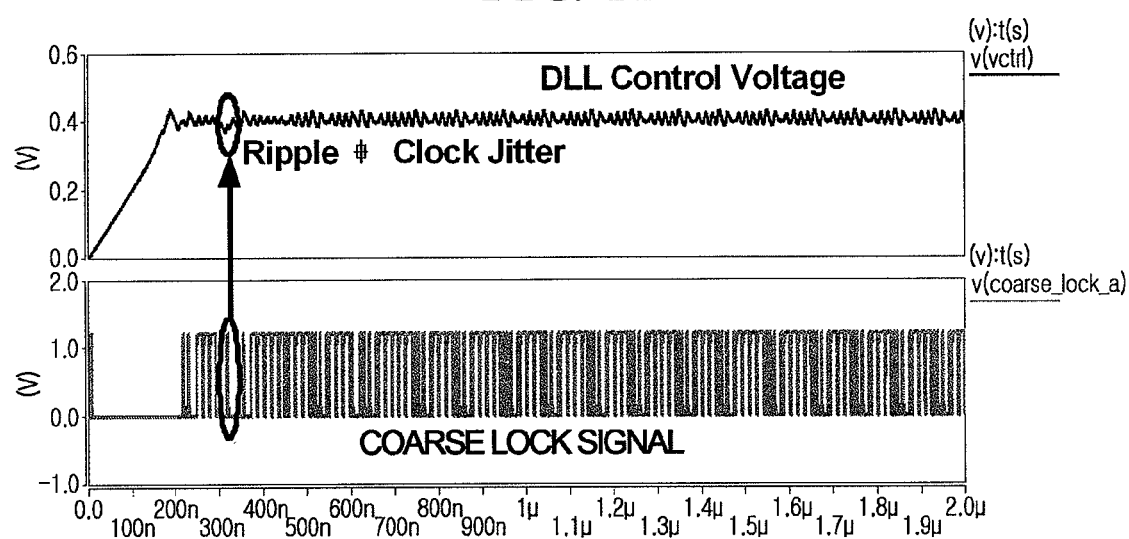
FIG. 11 shows simulation results obtained when the configuration of the frequency detection cells in the coarse lock detector of FIG. 3 was used.

FIGS. 10 and 11 show simulation results obtained when the frequency detection cells in the coarse lock detector of FIG. 3 was used. When the initial value of the control voltage is set to 0 V, an interval between multiphase clocks is reduced as the control voltage is increased. A simulation was conducted by applying to the coarse lock detector of FIG. 3 the control voltage having a value lower than a value that enables correct locking. In the simulation, the coarse lock detector detected an edge one cycle before an edge of a subsequent incoming multiphase clock as shown in FIG. 10. Therefore, false lock in which a DLL is wrongly detected as being in a coarse lock state occurred. Later, when a phase detector detected that the DLL was not in the coarse lock state, the coarse lock state was broken and recovered repeatedly. This phenomenon occurred as shown in FIG. 11.

Figure 12:
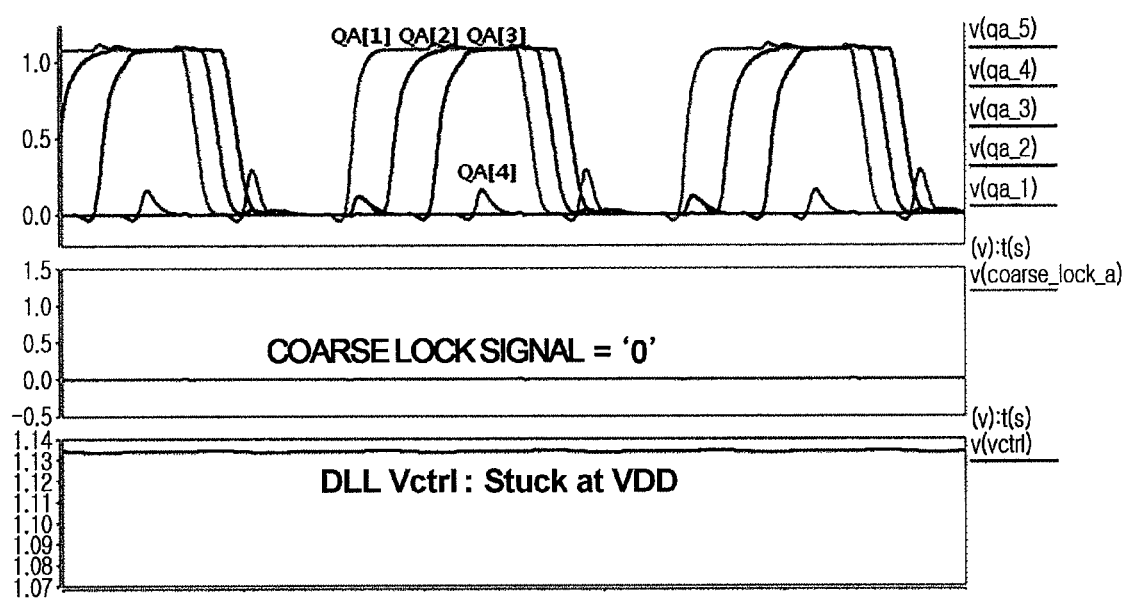
FIG. 12 shows simulation results obtained when the configuration of the frequency detection cells in the coarse lock detector of FIG. 4 was used.
Figure 13:
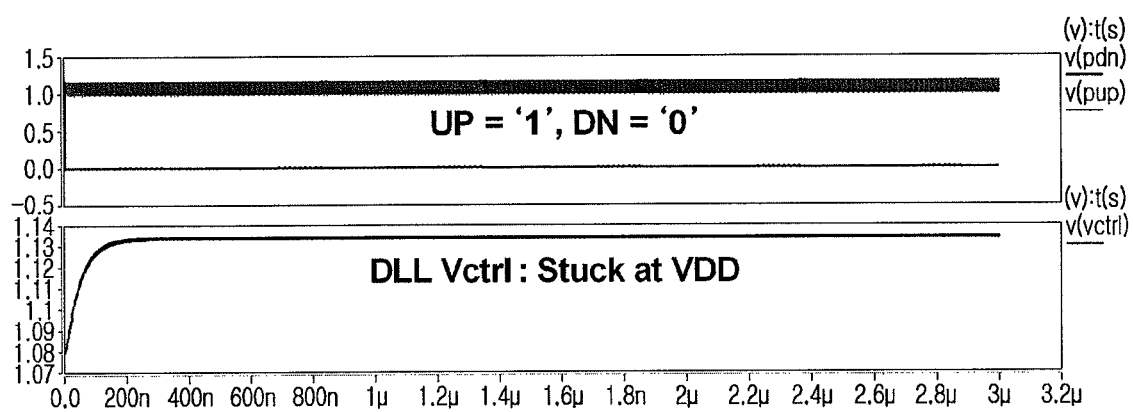
FIG. 13 shows simulation results obtained when the configuration of the frequency detection cells in the coarse lock detector of FIG. 4 was used.

FIGS. 12 and 13 show simulation results obtained when the frequency detection cells in the coarse lock detector of FIG. 4 was used in a high speed range. That is, when the initial value of the control voltage is set to VDD (1.2V), multiphase clocks spaced at very short intervals are generated. In this case, a large number of edges should ideally be counted, leading to the transmission of a DOWN signal. However, in the case of FIG. 4, rising edges of multiphase clocks cannot be properly sampled as described above. Once a rising edge of a multiphase clock fails to be sampled, rising edges of subsequent multiphase clocks cannot be counted. Consequently, a small number of edges are sampled, leading to the generation of an UP signal, which, in turn, causes the stuck problem.

As shown in FIG. 12, a coarse lock signal fails to become '1', and the control voltage (Vctrl) of a DLL is fixed to the vicinity of VDD. In other words, although the coarse lock detector continuously generates the UP signal as in FIG. 13 due to its wrong judgments, the stuck problem occurs, that is, the control voltage that has already reached VDD cannot go up further.

Figure 14:
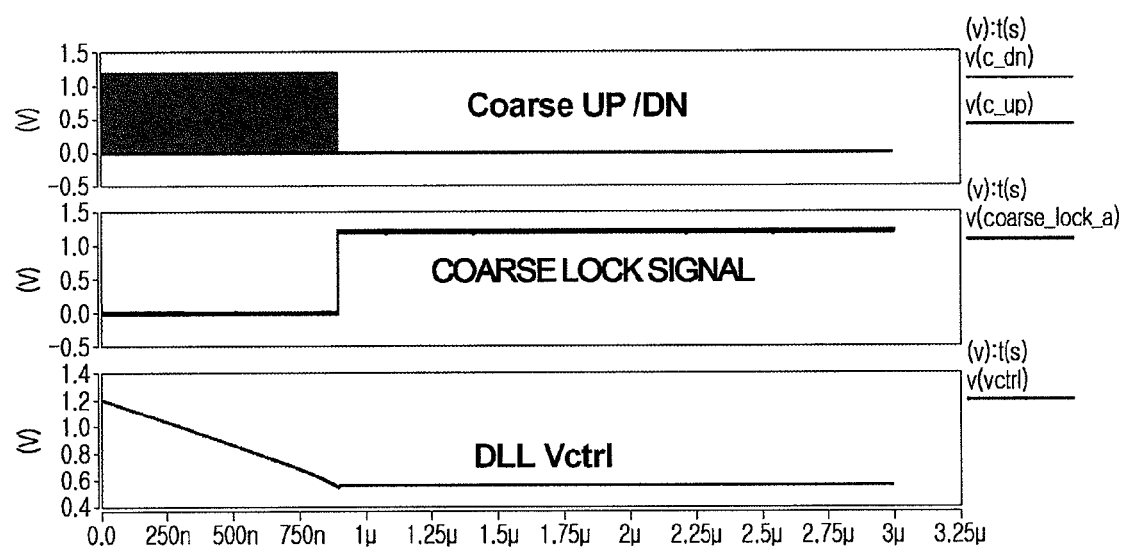
FIG. 14 shows simulation results obtained when the configuration of frequency detection cells in a coarse lock detector suggested in the present invention was used.
Figure 15:
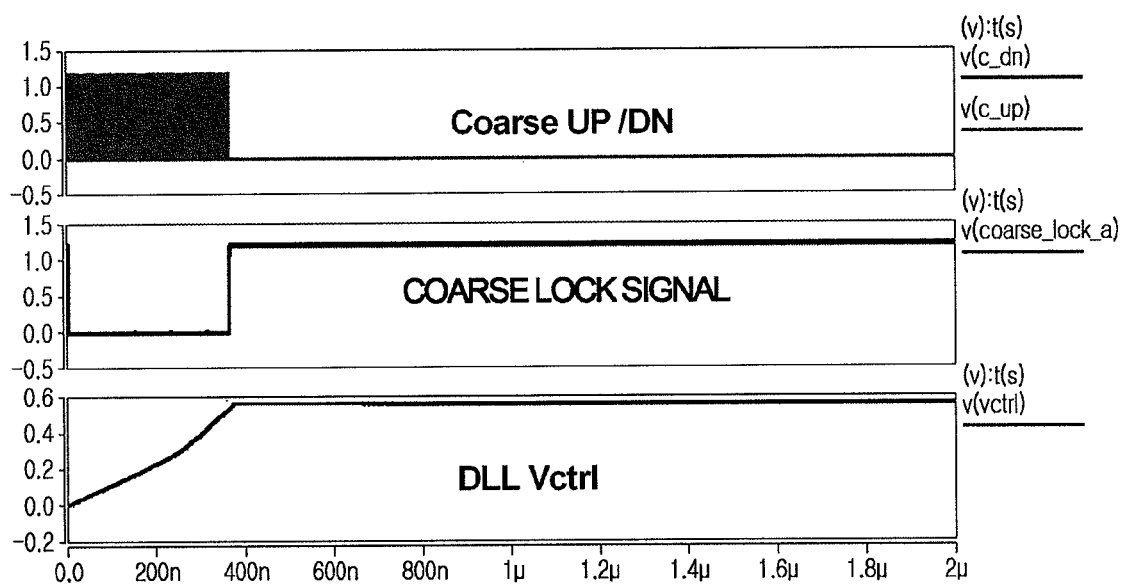
FIG. 15 shows simulation results obtained when the configuration of the frequency detection cells in an embodiment of a coarse lock detector was used.

FIGS. 14 and 15 show simulation results obtained when a coarse lock detector suggested in the above described embodiments was used. It can be understood from FIGS. 14 and 15 that coarse lock and DLL lock are achieved normally regardless of the initial value of the control voltage. FIG. 14 illustrates simulation results obtained under a condition that otherwise causes the stuck problem, and FIG. 15 illustrates simulation results obtained under a condition that otherwise causes harmonic lock. In the above two cases, a coarse lock signal was generated normally, and the control voltage of the DLL was locked in a normal range.

As described above, a coarse lock detector according to the embodiments enables a DLL to operate stably without a stuck problem and harmonic lock.

While various features and aspects have been particularly shown and described with reference to exemplary embodiments, it will be understood by those of ordinary skill in the art that various changes in form and detail may be made therein without departing from the spirit and scope of the present invention. The exemplary embodiments should be considered in a descriptive sense only and not for purposes of limitation.

What is claimed is:

1. A coarse lock detector comprising first through p-th detection cells which receive p multiphase clocks generated by incrementally delaying a reference clock, wherein the first through p-th detection cells are divided into a first detection cell group having detection cells defined by 3k+1 of the p-th detection cells, a second detection cell group having detection cells defined by 3s+2 of the p-th detection cells, and a third detection cell group having detection cells defined by 3r of the p-th detection cells, where p is an integer equal to or greater than four, k is an integer equal to or greater than zero when 3k+1 is equal to or smaller than p, s is an integer equal to or greater than zero when 3s+2 is equal to or smaller than p, and r is an integer equal to or greater than one when 3r is equal to or smaller than p, wherein each of the detection cells groups has the same number of cells, wherein at least one detection cell of the first detection cell group is only connected to at least one other detection cell of the first detection cell group, at least one detection cell of the second detection cell group is only connected to at least one other detection cell of the second detection cell group, and at least one detection cell of the third detection cell group is only connected to at least one other detection cell of the third detection cell group.

2. The coarse lock detector of claim 1, wherein the first detection cell receives a first input signal and generates an output signal, and each of the second through p-th detection cells receives first and second input signals and generates an output signal, wherein the first through p-th multiphase clocks are first input signals of the first through p-th detection cells, respectively.

3. The coarse lock detector of claim 2, wherein detection cells included in the first detection cell group are connected to each other such that an output signal of a (3k+1)-th detection cell is a second input signal of a (3(k+1)+1)-th detection cell.

4. The coarse lock detector of claim 2, wherein detection cells included in the second detection cell group are connected to each other such that an output signal of an (3s+2)-th detection cell is a second input signal of a (3(s+1)+2)-th detection cell.

5. The coarse lock detector of claim 2, wherein detection cells included in the third detection cell group are connected to each other such that an output signal of a 3r-th detection cell is a second input signal of a (3(r+1))-th detection cell.

6. The coarse lock detector of claim 2, wherein each of the first through p-th detection cells receives a clock signal, whose frequency is half a frequency of the reference clock, as a third input signal.

7. The coarse lock detector of claim 2, wherein the second input signal of the second detection cell is the output signal of the first detection cell.

8. The coarse lock detector of claim 2, wherein the second input signal of the third detection cell is the output signal of the second detection cell.

9. The coarse lock detector of claim 1, wherein the first detection cell comprises at least one flip-flop, and each of the second through p-th detection cells comprises at least one logic gate and at least one flip-flop.

10. The coarse lock detector of claim 9, wherein the at least one logic gate included in each of the second through p-th detection cells performs an AND operation on corresponding first and second input signals and sends the result of the AND operation to the corresponding at least one flip-flop.

11. The coarse lock detector of claim 1, wherein the first through p-th detection cells are set in response to rising edges of the received first through p-th multiphase clocks, respectively.

12. A coarse lock detector comprising first through P-th detection cells which receive P multiphase clocks generated by incrementally delaying a reference clock, wherein the first through P-th detection cells are divided into first through U-th detection cell groups corresponding to the first through P-th multiphase clocks, wherein each of the first through U-th detection cell groups comprises detection cells defined by $(1 \times A_{(W)}+W)$-th through $(U \times A_{(W)}+W)$-th, where U is an integer equal to or greater than four, P is an integer greater than U, W is an integer that satisfies $1 \leq W \leq U$, and $A_{(W)}$ is an integer equal to or greater than zero when each of $(1 \times A_{(W)}+W)$ through $(U \times A_{(W)}+W)$ is equal to or less than P, wherein each of the detection cells groups has the same number of cells, wherein at least one detection cell of each of the U-th detection cell groups are only connected to at least one other detection cell of the same U-th detection cell group.

13. The coarse lock detector of claim 12, wherein the first detection cell receives a first input signal and generates an output signal, and each of the second through P-th detection cells receives first and second input signals and generates an output signal, wherein the first through P-th multiphase clocks are first input signals of the first through P-th detection cells, respectively.

14. The coarse lock detector of claim 12, wherein detection cells included in a Z-th detection cell group among the U detection cell groups are connected to each other such that an output signal of a $(U \times A_{(Z)}+Z)$-th detection cell is a second input signal of a $(U \times (A_{(Z)}+1)+Z)$-th detection cell, where Z is an integer that satisfies $1 \leq Z \leq U$.

15. The coarse lock detector of claim 13, wherein each of the first through P-th detection cells receives a clock signal, whose frequency is half a frequency of the reference clock, as a third input signal.

16. The coarse lock detector of claim 13, wherein the second input signal of a Y-th detection cell is the output signal of a (Y−1)-th detection cell, where Y is an integer that satisfies $2 \leq Y \leq U$.

17. The coarse lock detector of claim 12, wherein the first detection cell comprises at least one flip-flop, and each of the second through P-th detection cells comprises at least one logic gate and at least one flip-flop.

18. The coarse lock detector of claim 17, wherein the at least one logic gate included in each of the second through P-th detection cells performs an AND operation on corresponding first and second input signals and sends the result of the AND operation to the corresponding at least one flip-flop.

19. The coarse lock detector of claim 12, wherein the first through p-th detection cells are set in response to rising edges of the received first through p-th multiphase clocks, respectively.

* * * * *